(12) United States Patent
Suzuki (10) Patent No.: US 7,535,277 B2
(45) Date of Patent: May 19, 2009

(54) FREQUENCY DIVIDING PHASE SHIFT CIRCUIT

(75) Inventor: Shigeya Suzuki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 230 days.

(21) Appl. No.: 11/783,656

(22) Filed: Apr. 11, 2007

(65) Prior Publication Data

US 2007/0236264 A1      Oct. 11, 2007

(30) Foreign Application Priority Data

Apr. 11, 2006   (JP)   .............................. 2006-108412

(51) Int. Cl.
*H03K 25/00*   (2006.01)
(52) U.S. Cl. .................. 327/254; 327/117; 327/258
(58) Field of Classification Search ................. 327/115, 327/117, 238, 239, 243, 254–259, 360; 377/47
See application file for complete search history.

(56) References Cited

U.S. PATENT DOCUMENTS

| 4,700,350 | A | * | 10/1987 | Douglas et al. | ............. | 714/775 |
| 6,518,805 | B2 | * | 2/2003 | Tam et al. | .................... | 327/115 |
| 6,894,551 | B2 | * | 5/2005 | Johnson | ...................... | 327/258 |
| 7,403,048 | B2 | * | 7/2008 | Heidari et al. | ............... | 327/117 |

FOREIGN PATENT DOCUMENTS

JP          2816675         8/1998

* cited by examiner

*Primary Examiner*—Lincoln Donovan
*Assistant Examiner*—William Hernandez
(74) *Attorney, Agent, or Firm*—Young & Thompson (57) ABSTRACT

A frequency dividing phase shift circuit includes a first frequency divider and a second frequency divider. The first frequency divider is configured to perform 1/(2n+1) (n is a natural number) frequency division on an input signal having a frequency of (freq*2(2n+1)) ("freq" indicates a frequency) to generate a first signal having a frequency of (freq*2). The second frequency divider is configured to perform ½ frequency division on the first signal to generate 4-phase signals which are different in phase by 90 degrees one after another.

14 Claims, 7 Drawing Sheets

Fig. 5A  IN 
Fig. 5B  D 
Fig. 5C  $\overline{D}$ 
Fig. 5D  Qm 
Fig. 5E  Qm' 
Fig. 5F  Qs 
Fig. 5G  Qs'

Fig. 6

Fig. 7A  IN (freq_6)
Fig. 7B  a (freq_2)
Fig. 7C  b (freq_2)
Fig. 7D  b̄ (freq_2)
Fig. 7E  c (freq_2)
Fig. 7F  d̄ (freq_2)
Fig. 7G  OUT_0 (freq_1)
Fig. 7H  OUT_180 (freq_1)
Fig. 7I  OUT_90 (freq_1)
Fig. 7J  OUT_270 (freq_1)

FREQUENCY DIVIDING PHASE SHIFT CIRCUIT

BACKGROUND OF THE INVENTION

1. Field of the Invention

The present invention relates to a frequency dividing phase shift circuit, and more particularly to a frequency dividing phase shift circuit which is applied to a receiver to output 4-phase output signals different in phase by 90 degrees one after another.

2. Description of the Related Art

There are known communication apparatuses using an ISM (industrial, scientific and medical) radio band, a radio band for a specific small power communication and the like. In recent years, miniaturization and low power consumption are demanded in the communication apparatus, and many functions provided therein are subjected to IC implementation. More specifically, the IC implementation of circuits such as an LNA, Mixer, IF filter, oscillator, PLL frequency synthesizer, and demodulator in a receiver is advanced. Particularly, in a receiver mainly used for a remote keyless entry (RKE) and a tire pneumatic pressure monitoring system (TPMS), it is preferably possible to receive an electromagnetic wave signal in a 315 MHz band, a 434 MHz band and an 868 MHz band by using the same IC, so as to deal with adjustable to various domestic and foreign specifications. Furthermore, an IF frequency band is shifted from a conventional 10.7 MHz band to a few hundred kHz in accordance with incorporation of the IF filter, in which an IRM (Information Rights Management) capable of removing an image signal is required.

In order to realize the receiver as described above, a ⅙ frequency dividing phase shift circuit is necessary for a 315 MHz band, a ¼ frequency dividing phase shift circuit for a 434 MHz band, and a ½ frequency dividing phase shift circuit for an 868 MHz band, in which 4-phase signals can be outputted.

Generally, a $½^n$ (n is a natural number) frequency dividing phase shift circuit performs frequency division on a signal having the frequency of about 1.8 GHz and generated by an oscillator, and generates the 4-phase signals shifted by 90 degrees one after another. The $½^n$ frequency dividing phase shift circuit is generally realized by a $½^{(n-1)}$ frequency dividing circuit for outputting a signal having the duty of 50%, and a 4-phase signal output circuit. The $½^{(n-1)}$ frequency dividing circuit is provided with gate-type D-type flip-flop circuits of (n−1) stages, and the 4-phase signal output circuit is provided with a D-type flip-flop circuit of one stage. However, in case of the ⅙ frequency dividing phase shift circuit, if a ⅓ frequency dividing circuit and the 4-phase signal output circuit are simply combined, 4-phase signals having phases different by 90 degrees one after another cannot be outputted because the duty of output of the ⅓ frequency dividing circuit is not 50%. Accordingly, a circuit configuration is complicated to realize the ⅙ frequency dividing phase shift circuit for outputting the 4-phase signals.

As a conventional frequency dividing phase shift circuits, a chrominance subcarrier signal generating apparatus is disclosed in Japanese Patent No. 2,816,675 (first conventional example), in which a chrominance subcarrier signal having different phases is outputted for balanced modulation of two color difference signals.

Figure 1:
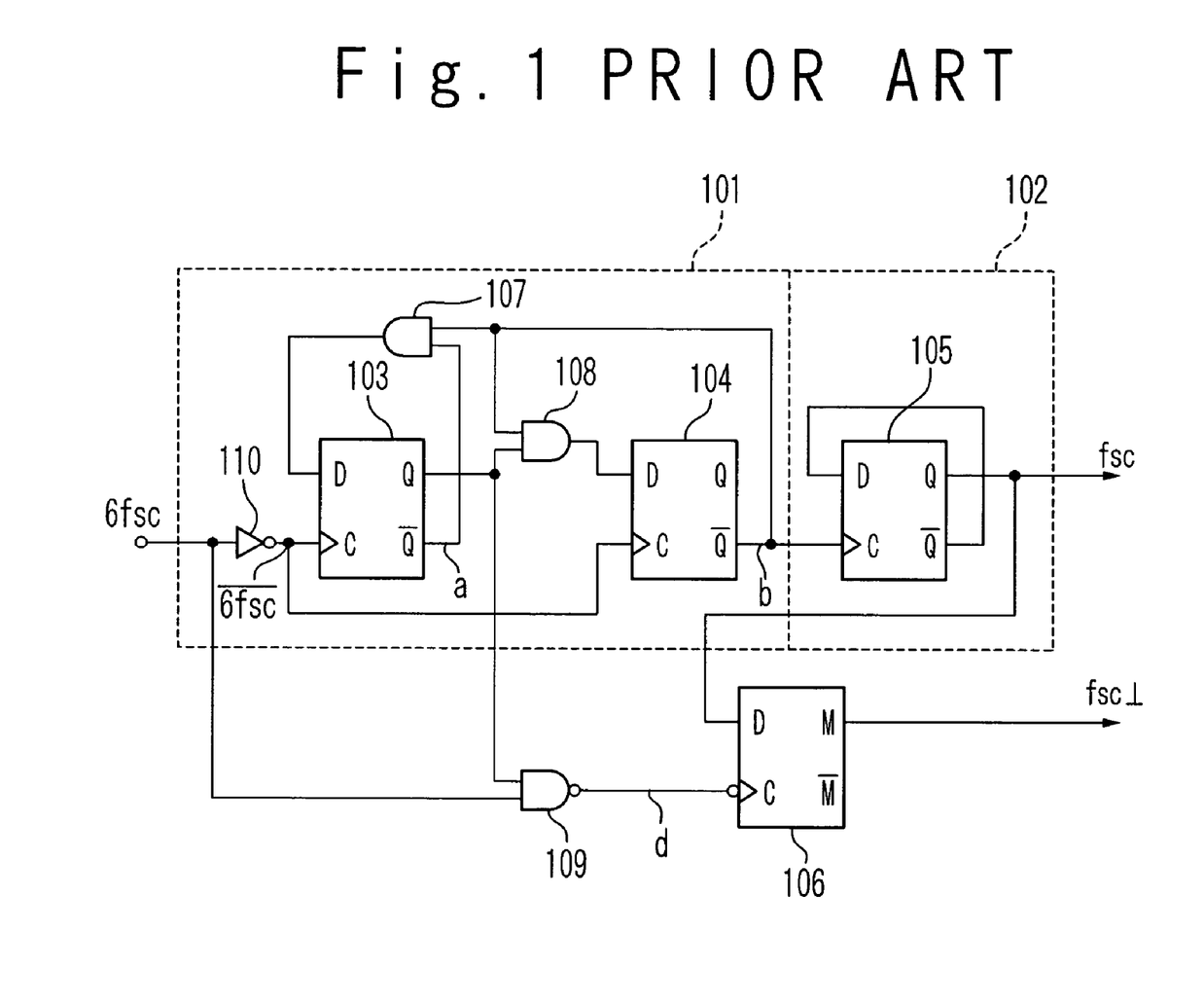
FIG. 1 is a circuit diagram showing a configuration of a frequency dividing phase shift circuit in a first conventional example.

FIG. 1 shows the configuration of a frequency dividing phase shift circuit described in the first conventional example. This frequency dividing phase shift circuit includes a first frequency dividing circuit 101 for ⅓ frequency division, a second frequency dividing circuit 102 for ½ frequency division, an NAND circuit 109, and a latch circuit 106.

The first frequency dividing circuit 101 is provided with gate type D-type flip-flop circuits 103 and 104, AND circuits 107 and 108, and an inverter circuit 110. The second frequency dividing circuit 102 is provided with a gate type D-type flip-flop circuit 105. The latch circuit 106 is composed of a gate type D-type flip-flop circuit.

As an external input signal, a chrominance subcarrier signal 6 fsc having six times of a frequency is supplied to the inverter circuit 110 and the NAND circuit 109. An output of the inverter circuit 110 is supplied to a clock input C of the gate-type D-type flip-flop circuit 103 and a clock input C of the gate-type D-type flip-flop circuit 104. An output Q of the gate-type D-type flip-flop circuit 103 is supplied to the AND circuit 108 and the NAND circuit 109. An inversion output $Q^-$ of the gate-type D-type flip-flop circuit 103 is supplied to the AND circuit 107. An inversion output $Q^-$ of the gate-type D-type flip-flop circuit 104 is supplied to a clock input C of the gate-type D-type flip-flop circuit 105, the AND circuit 108 and the AND circuit 107. An output of the AND circuit 107 is supplied to a data input D of the gate-type D-type flip-flop circuit 103. An output of the AND circuit 108 is supplied to a data input. D of the gate-type D-type flip-flop circuit 104. An inversion output $Q^-$ of the gate-type D-type flip-flop circuit 105 is supplied to a data input D thereof. The gate-type D-type flip-flop circuit 105 provides an output Q thereof as a first chrominance subcarrier signal fsc. An output Q of the gate-type D-type flip-flop circuit 105 is supplied to a data input D of the latch circuit 106. An output of the NAND circuit 109 is inverted and supplied to a clock input C of the latch circuit 106. The latch circuit 106 provides an output M thereof as a second chrominance subcarrier signal $fsc^{\perp}$.

Each of the gate-type D-type flip-flop circuits 103, 104 and 105 latches the data input D in response to a falling edge of a signal supplied to the clock input C. As a result, the output Q and the inversion output $Q^-$ in the preceding state are held as the output Q and the inversion output $Q^-$ of the gate-type D-type flip-flop circuit.

Figure 2:
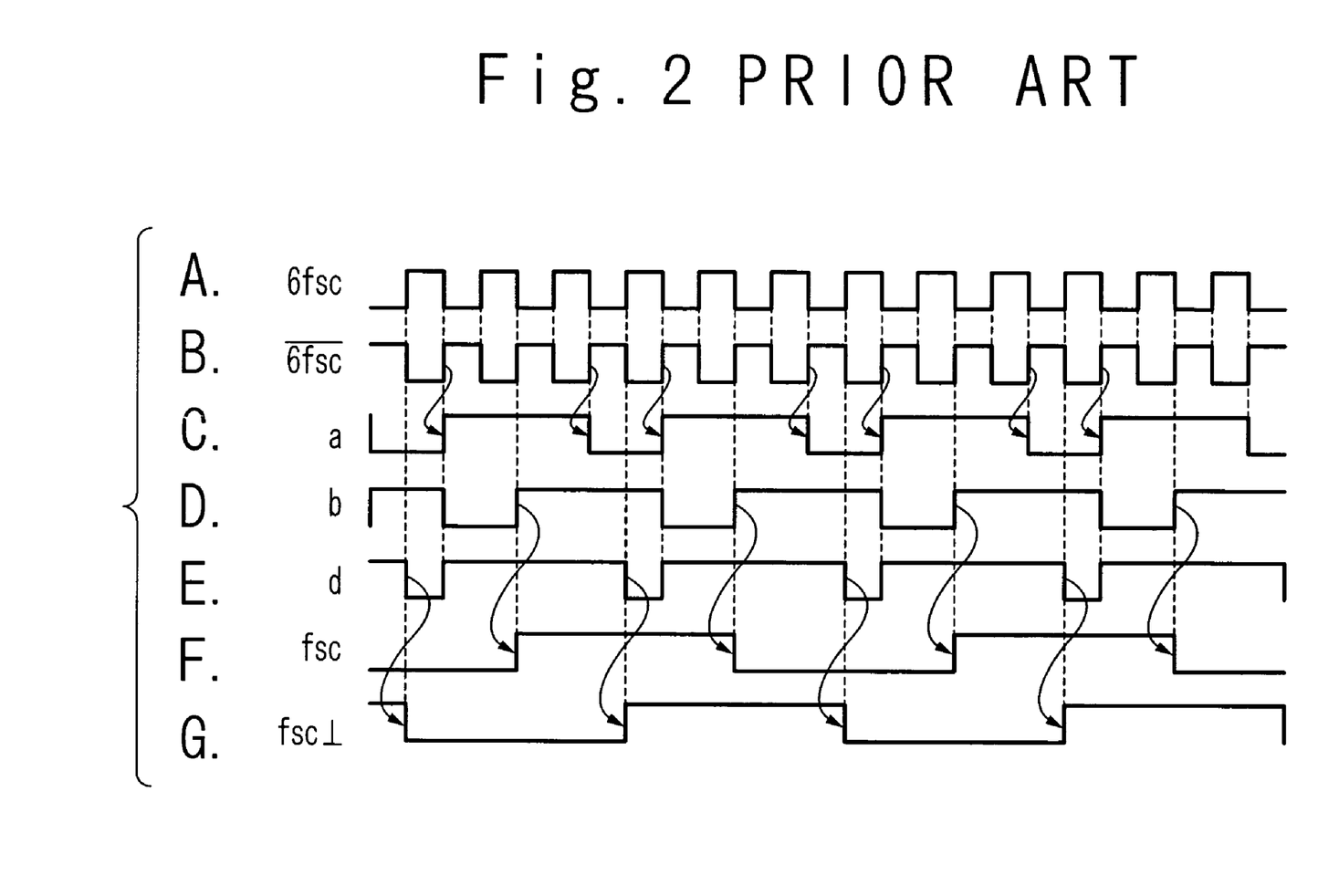
FIGS. 2A to 2G are timing charts showing an operation of the frequency dividing phase shift circuit shown in FIG. 1.

FIGS. 2A to 2G are timing charts showing an operation of the frequency dividing phase shift circuit described in the first conventional example. In the first frequency dividing circuit 101, the data input of the circuit 103 as the output of the AND circuit 107 is delayed by 120 degrees and outputted as the output Q and the inversion output $Q^-$, as shown in FIG. 2C by a. Also, the data input of the circuit 104 as the output of the AND circuit 108 is delayed by 120 degrees and outputted as the output Q and the inversion output $Q^-$, as shown in FIG. 2D by b. The gate-type D-type flip-flop circuit 105 in the second frequency dividing circuit 102 frequency-divides the signal b into a half. Thus, the ⅙ frequency division signal or first chrominance subcarrier signal fsc is obtained. Also, by using the clock signal 6 fsc, the gate-type D-type flip-flop circuit 106 generates the second chrominance subcarrier signal $fsc^{\perp}$ from first chrominance subcarrier signal fsc.

However, the frequency dividing phase shift circuit described in the first conventional example is provided with the gate-type D-type flip-flop circuits for three stages, the latch circuit for one stage, the inverter circuit for one stage, and the AND circuits for three stages with the NAND circuit for one stage. Therefore, a circuit is complex with a large number of the circuit elements. As a result, it is not suitable for implementing low current consumption and reduction of a chip layout.

SUMMARY OF THE INVENTION

In an aspect of the present invention, a frequency dividing phase shift circuit includes a first frequency divider and a second frequency divider. The first frequency divider is configured to perform 1/(2n+1) (n is a natural number) frequency division on an input signal having a frequency of (freq*2(2n+1)) ("freq" indicates a frequency) to generate a first signal having a frequency of (freq*2). The second frequency divider is configured to perform ½ frequency division on the first signal to generate 4-phase signals which are different in phase by 90 degrees one after another.

Here, the first frequency divider includes (n+1)-stage master-slave type flip-flop circuits connected in series; and a NOR circuit configured to receive outputs of the (n+1)-stage master-slave type flip-flop circuits based on a value of (2n+1) and to output a NOR calculation result to a first stage master-slave type flip-flop circuit.

The second frequency divider may include a 1-stage master-slave type flip-flop circuit connected to the first frequency divider.

Also, each of the master-slave type flip-flop circuit may include a master-side flip-flop having a data input, a data inversion input, a data output and a data inversion output; and a slave-side flip-flop having a data input, a data inversion input, a data output and a data inversion output. The data input and the data inversion input of the slave-side flip-flop may be connected to the data output and the data inversion output of the master-side flip-flop.

Also, the data output and the data inversion output of the slave-side flip-flop in a j-th (1≦j≦n) stage master-slave flip-flop may be connected to the data input and the data inversion input of the master-side flip-flop in a (j+1)-th stage master-slave type flip-flop circuit in the first frequency divider. A clock input signal may be supplied to a clock input of the master-side flip-flop in each of the (n+1)-stage master-slave type flip-flop circuits and an inversion of the clock input signal may be supplied to an clock input of the slave-side flip-flop in each of the (n+1)-stage master-slave type flip-flop circuits. The data inversion output of the slave-side flip-flop in a first stage of the (n+1)-stage master-slave type flip-flop circuits may be connected to a clock input of the slave-side flip-flop of the 1-stage master-slave type flip-flop circuit. The data inversion output of the slave-side flip-flop in an (n+1)-th stage of the (n+1)-stage master-slave type flip-flop circuits may be connected to a clock input of the master-side flip-flop of the 1-stage master-slave type flip-flop circuit. The data output and the data inversion output of the slave-side flip-flop of the 1-stage master-slave type flip-flop circuit may be connected to the data inversion input and the data input of the master-side flip-flop of the 1-stage master-slave type flip-flop circuit, respectively.

Also, the second frequency divider may output the data output and the data inversion output of the slave-side flip-flop of the 1-stage master-slave type flip-flop circuit as signals having phase shifts of 0 degrees and 180 degrees, and the data output and the data inversion output of the master-side flip-flop of the 1-stage master-slave type flip-flop circuit as signals having phase shifts of 90 degrees and 270 degrees, respectively.

Also, when n=1, two inputs of the NOR circuit may be connected to the data output of the first stage master-slave type flip-flop circuit and the data output of the (n+1)-th stage master-slave type flip-flop circuit.

In another aspect of the present invention, a method of generating 4-phase signals from an inputted clock signal, is achieved by performing 1/(2n+1) (n is a natural number) frequency division on an inputted clock signal having a frequency of (freq*2(2n+1)) ("freq" indicates a frequency) to generate a first signal having a frequency of (freq*2); and by performing ½ frequency division on the first signal to generate 4-phase signals which are different in phase by 90 degrees one after another.

The performing 1/(2n+1) frequency division may be achieved by providing (n+1)-stage master-slave type flip-flop circuits connected in series; and by providing a NOR circuit configured to receive outputs of the (n+1)-stage master-slave type flip-flop circuits based on a value of (2n+1) and to output a NOR output to a first stage master-slave type flip-flop circuit.

Also, the performing ½ frequency division may be achieved by providing a 1-stage master-slave type flip-flop circuit connected to the first frequency divider.

Also, each of the master-slave type flip-flop circuit may include a master-side flip-flop having a data input, a data inversion input, a data output and a data inversion output; and a slave-side flip-flop having a data input, a data inversion input, a data output and a data inversion output. At this time, The performing 1/(2n+1) frequency division may be achieved by connecting the data input and the data inversion input of the slave-side flip-flop to the data output and the data inversion output of the master-side flip-flop. The performing ½ frequency division may be achieved by connecting the data input and the data inversion input of the slave-side flip-flop to the data output and the data inversion output of the master-side flip-flop.

Also, the performing 1/(2n+1) frequency division may be achieved by supplying a clock input signal to a clock input of the master-side flip-flop in each of the (n+1)-stage master-slave type flip-flop circuits and an inversion of the clock input signal to an clock input of the slave-side flip-flop in each of the (n+1)-stage master-slave type flip-flop circuits; and by connecting the data output and the data inversion output of the slave-side flip-flop in a j-th (1≦j≦n) stage master-slave flip-flop to the data input and the data inversion input of the master-side flip-flop in a (j+1)-th stage master-slave type flip-flop circuit. The performing ½ frequency division may be achieved by connecting the data inversion output of the slave-side flip-flop in a first stage of the (n+1)-stage master-slave type flip-flop circuits to a clock input of the slave-side flip-flop of the 1-stage master-slave type flip-flop circuit; by connecting the data inversion output of the slave-side flip-flop in an (n+1)-th stage of the (n+1)-stage master-slave type flip-flop circuits to a clock input of the master-side flip-flop of the 1-stage master-slave type flip-flop circuit; and by connecting the data output and the data inversion output of the slave-side flip-flop of the 1-stage master-slave type flip-flop circuit to the data inversion input and the data input of the master-side flip-flop of the 1-stage master-slave type flip-flop circuit, respectively.

Also, the performing ½ frequency division may be achieved by outputting the data output and the data inversion output of the slave-side flip-flop of the 1-stage master-slave type flip-flop circuit as signals having phase shifts of 0 degrees and 180 degrees; and by outputting the data output and the data inversion output of the master-side flip-flop of the 1-stage master-slave type flip-flop circuit as signals having phase shifts of 90 degrees and 270 degrees, respectively.

Also, the performing 1/(2n+1) frequency division may be achieved by connecting two inputs of the NOR circuit to the data output of the first stage master-slave type flip-flop circuit and the data output of the (n+1)-th stage master-slave type flip-flop circuit, when n=1.

It is possible in the present invention to provide a 4-phase output 2 (2n+1) phase shift circuit which is suitable for IC implementation due to a small number of circuits, simple configuration, implementation of low current consumption and chip layout area reduction.

DESCRIPTION OF THE PREFERRED EMBODIMENTS

Hereinafter, a frequency dividing phase shift circuit according to the present invention will be described in detail with reference to the attached diagrams.

Figure 3:
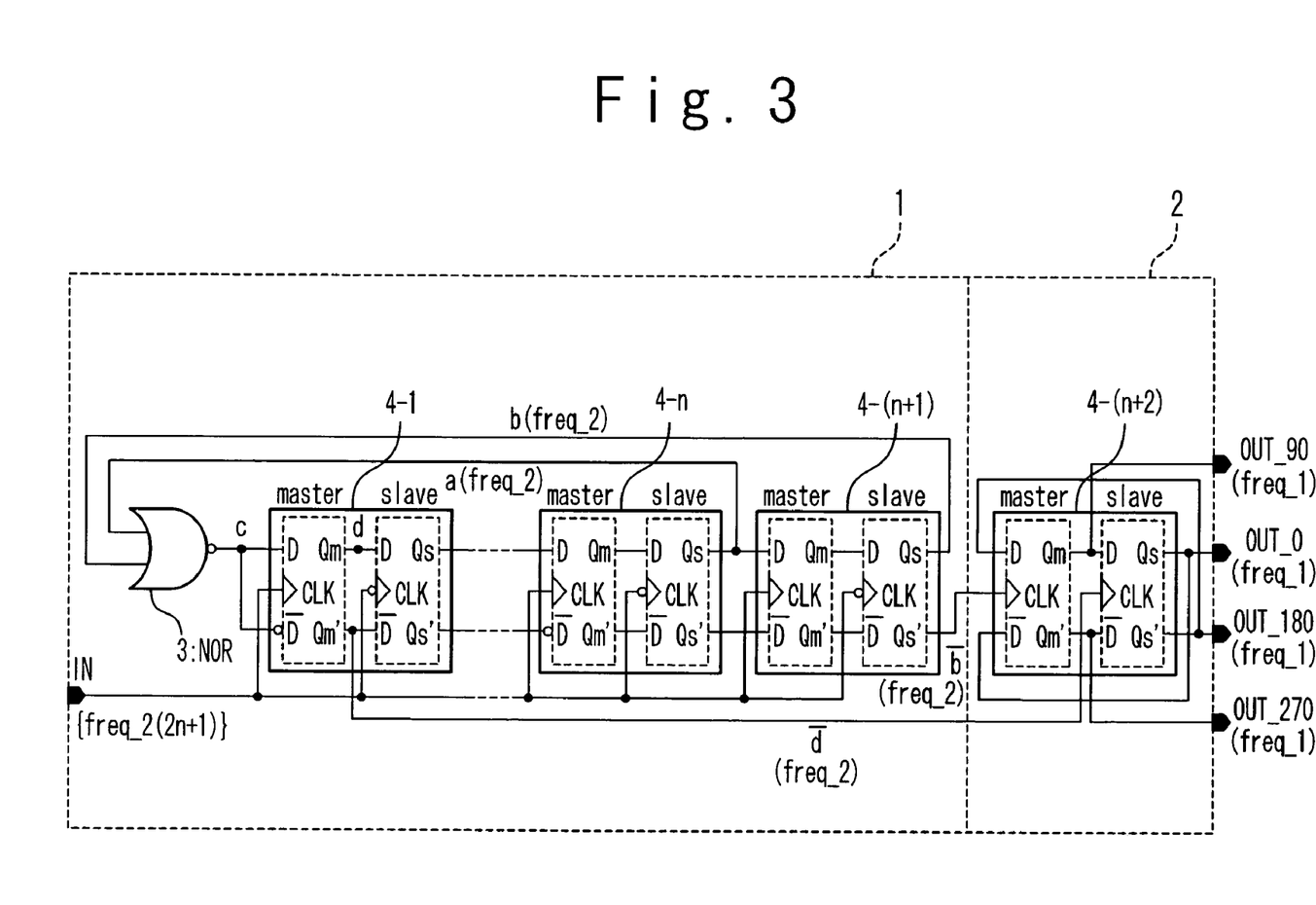
FIG. 3 is a circuit diagram showing a configuration of a frequency dividing phase shift circuit according to a first embodiment of the present invention.

FIG. 3 shows a configuration of a frequency dividing phase shift circuit according to the first embodiment of the present invention. Here, it is assumed that n is a natural number. The frequency dividing phase shift circuit according to the first embodiment of the present invention includes a first frequency dividing circuit 1 and a second frequency dividing circuit 2. The first frequency dividing circuit 1 receives an input signal IN having the frequency of (freq_2 (2n+1)), and generates a signal having the frequency of (freq_2), which is twice of the frequency (freq). The second frequency dividing circuit 2 generates 4-phase signals having the frequency (freq) and having phases shifted by 90 degrees one after another, i.e., signals (OUT_0), (OUT_90), (OUT_180) and (OUT_270), by frequency-dividing the signal having the frequency (freq_2).

Figure 4:
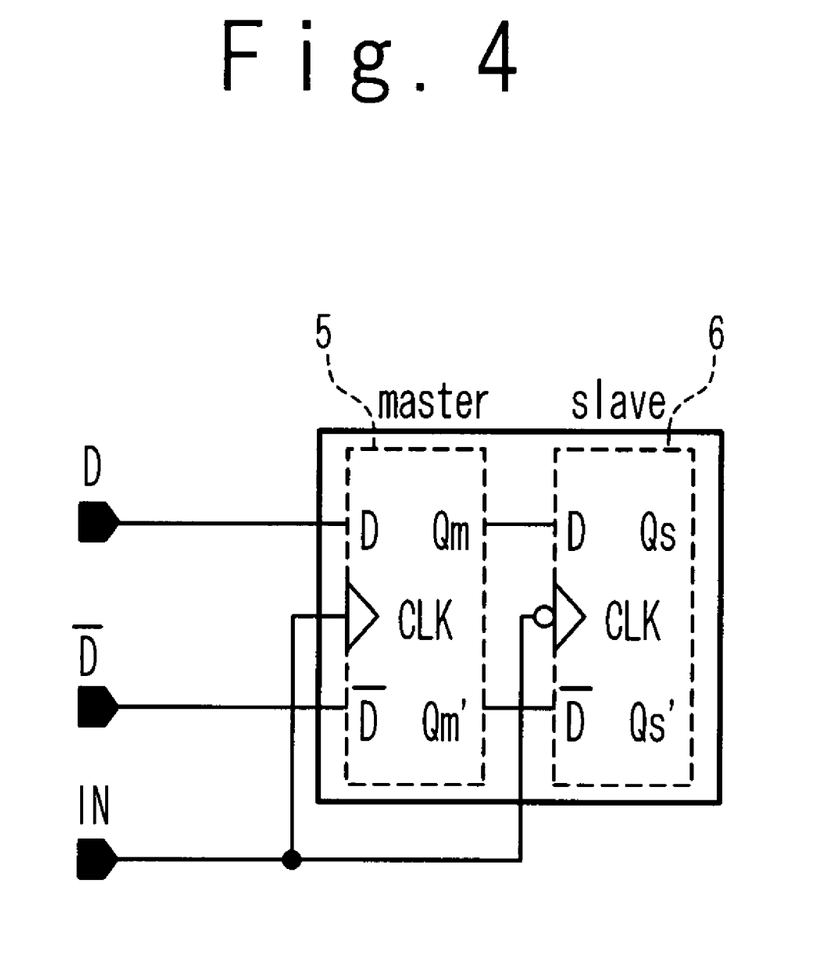
FIG. 4 is a circuit diagram showing the configuration of a master-slave type flip-flop circuit.
Figures 5A, 5B, 5C:
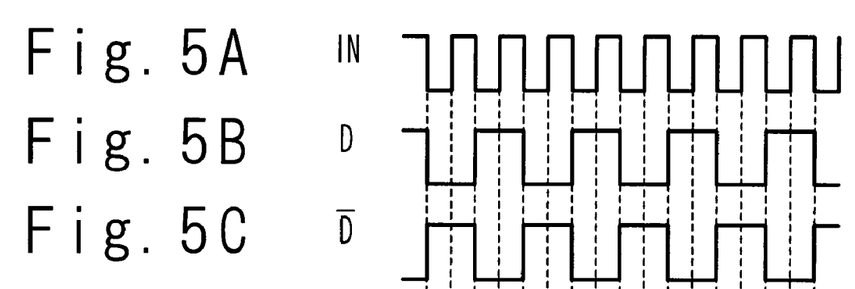
FIGS. 5A to 5G are timing charts showing an operation of the master-slave type flip-flop circuits of (n+2) stages.
Figures 5D, 5E, 5F, 5G:
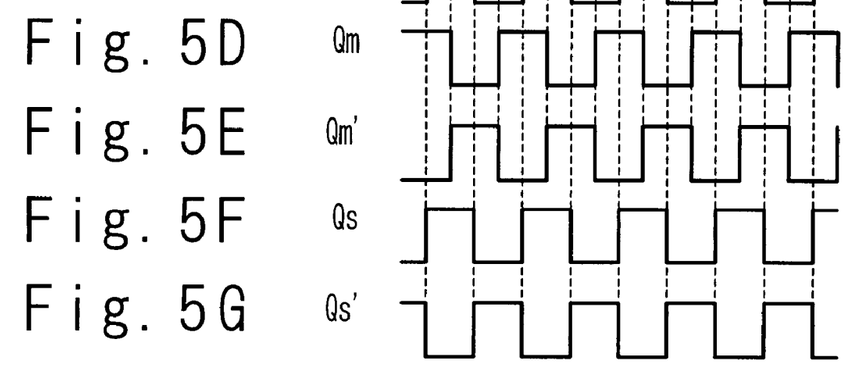

The first frequency dividing circuit 1 is provided with a NOR circuit 3, and master-slave-type D-type flip-flop circuits 4–1 to 4–(n+1) for (n+1) stages are connected in series. The second frequency dividing circuit 2 is provided with a master-slave-type D-type flip-flop circuit 4–(n+2). FIG. 4 shows a configuration of the master-slave-type D-type flip-flop circuit. The master-slave-type D-type flip-flop circuit is provided with a master-side D-type flip-flop circuit 5, and a slave-side D-type flip-flop circuit 6. The master-side D-type flip-flop circuit 5 and the slave-side D-type flip-flop circuit 6 have clock inputs CLK, data inputs D, data inversion inputs D⁻, output Qm and Qs, and inversion outputs Qm' and Qs'. The output and inversion output of the master-side flip-flop circuit 5 are connected to the data input and the data inversion input in the slave-side flip-flop circuit 6, respectively.

In the first frequency dividing circuit 1, the input signal IN having the frequency of (freq_2 (2n+1)), which is a frequency (freq) multiplied by 2(2n+1), is supplied as an external input signal to the clock input CLK of the master-side flip-flop circuit 5 in each of the master-slave type D-type flip-flop circuits 4-1 to 4-(n+1) of the (n+1) stages. The input signal IN is inverted and supplied to the clock input CLK of the slave-side flip-flop circuit 6 in each of the master-slave type D-type flip-flop circuits 4-1 to 4-(n+1) of the (n+1) stages. Each of the master-slave type D-type flip-flop circuits 4-1 to 4-(n+1) is connected in series. That is, the output Qs and the inversion output Qs' of the slave-side flip-flop circuit 6 in the master-slave type D-type flip-flop circuit 4-j of the j-th stage (j is an integer satisfying 1≦j≦n) are connected to the data input D and the data inversion input D⁻ of the master-side flip-flop circuit 5 in the master-slave type D-type flip-flop circuit 4-(j+1) of the (j+1)-th stage, respectively. A signal a is the output Qs of the slave-side flip-flop circuit 6 of the master-slave-type D-type flip-flop circuit 4-n and a signal b is the output Qs of the slave-side flip-flop circuit 6 of the master-slave-type D-type flip-flop circuit 4-(n+1). The signals a and b are supplied to the NOR circuit 3. The NOR circuit 3 generates a signal c. The signal c is supplied to the data input D of the master-side flip-flop circuit 5 in the master-slave-type D-type flip-flop circuit 4-1, and is inverted and then supplied to the data inversion input D⁻ of the master-side flip-flop circuit 5 in the master-slave-type D-type flip-flop circuit 4-1.

In the second frequency dividing circuit 2, an inversion output Qs' of the slave-side flip-flop circuit 6 in the master-slave-type D-type flip-flop circuit 4-(n+1) is supplied as a signal b to the clock input CLK of the master-side flip-flop circuit 5 in the master-slave-type D-type flip-flop circuit 4-(n+2). An inversion output Qm' of the master-side flip-flop circuit 5 in the master-slave-type D-type flip-flop circuit 4-1 is supplied as a signal d⁻ to the clock input CLK of the slave-side flip-flop circuit 6 in the master-slave-type D-type flip-flop circuit 4-(n+2). The slave-side flip-flop circuit 6 in the master-slave-type D-type flip-flop circuit 4-(n+2) outputs the output signal OUT_0 as the output Qs. The output Qs of the slave-side flip-flop circuit 6 in the master-slave-type D-type flip-flop circuit 4-(n+2) is supplied to the data inversion input D⁻ of the master-side flip-flop circuit 5 in the master-slave-type D-type flip-flop circuit 4-(n+2). The slave-side flip-flop circuit 6 in the master-slave-type D-type flip-flop circuit 4-(n+2) outputs the output signal OUT_180 as the inversion output Qs'. The inversion output Qs' of the slave-side flip-flop circuit 6 in the master-slave-type D-type flip-flop circuit 4-(n+2) is supplied to the data input D of the master-side flip-flop circuit 5 in the master-slave-type D-type flip-flop circuit 4-(n+2). The master-side flip-flop circuit 5 in the master-slave-type D-type flip-flop circuit 4-(n+2) outputs the output signal OUT_90 as the output Qm. The master-side flip-flop circuit 5 in the master-slave-type D-type flip-flop circuit 4-(n+2) outputs the output signal OUT_270 as the inversion output Qm'.

FIGS. 5A to 5G are timing charts showing an operation of each of the MSFF circuits 4-1 to 4-(n+2) of the (n+2) stages. In the master-slave-type D-type flip-flop circuit, when the input levels of the clock input CLK, the data input D, and the data inversion input D⁻ of the master-side flip-flop circuit 5 are a high level, the high level and a low level, and the clock input CLK of the slave-side flip-flop circuit 6 is the low level, the output levels of the output Qm and the inversion output Qm' of the master-side flip-flop circuit 5 are the high level and the low level, and the output levels of the output Qs and the inversion output Qs' of the slave-side flip-flop circuit 6 are the low level and the high level.

Next, in the above state of the master-slave-type D-type flip-flop circuit, when the input levels of the clock input CLK, the data input D, and the data inversion input D⁻ of the master-side flip-flop circuit 5 are the high level, the high level and the low level to the high level, and the clock input CLK of the slave-side flip-flop circuit 6 is the low level to the high level, the output levels of the output Qm and the inversion output Qm' of the master-side flip-flop circuit 5 hold the previous states, and the output levels of the output Qs and the inversion output Qs' of the slave-side flip-flop circuit 6 change from the low level and the high level to the high level and the low level.

Next, in the above state of the master-slave-type D-type flip-flop circuit, when the input level of the clock input CLK of the master-side flip-flop circuit 5 changes from the low level to the high level, the output levels of the output Qm and the inversion output Qm' of the master-side flip-flop circuit 5 change from the high level and the low level to the low level and the high level, and the output levels of the output Qs and the inversion output Qs' of the slave-side flip-flop circuit 6 hold the previous states.

Next, in the above state of the master-slave-type D-type flip-flop circuit, when the input levels of the clock input CLK, the data input D and the data inversion input D⁻ of the master-side flip-flop circuit 5 changes from the high level, the low level and the high level to the low level, the high level and the low level, the input level of the clock input CLK of the slave-side flip-flop circuit 6 changes from the low level to the high level, so that the output Qm and the inversion output Qm' the master-side flip-flop circuit 5 hold the previous states, and the output Qs and the inversion output Qs' of the slave-side flip-flop circuit 6 change from the high level and the low level to the low level and the high level, respectively.

Next, in the above state of the master-slave-type D-type flip-flop circuit, when the input level of the clock input CLK of the master-side flip-flop circuit 5 changes from the low level to the high level, the output levels of the output Qm and the inversion output Qm' of the master-side flip-flop circuit 5 change from the low level and the high level to the high level and the low level, and the output levels of the output Qs and the inversion output Qs' of the slave-side flip-flop circuit 6 hold the previous states.

Next, an operation of the frequency dividing phase shift circuit according to the first embodiment of the present invention will be described.

First, an operation of the first frequency dividing circuit 1 will be described. The master-slave-type D-type flip-flop circuits 4-1 to 4-(n+1) perform 1/(2n+1) frequency division on the input signal IN having a frequency of (freq_2 (2n+1)) to generate a signal having the frequency of twice of a frequency (freq), i.e., (freq_2), and the signal having the twice of the frequency (freq_2) is outputted from the master-slave-type D-type flip-flop circuit 4-(n+1).

The signals outputted from the output Qm and the inversion output Qm' of the master-side flip-flop circuit 5 in each of the master-slave-type D-type flip-flop circuits 4-1 to 4-(n+1) have a phase delayed by one-fourth of a period with respect to the signals outputted from the output Qs and the inversion output Qs' of the slave-side flip-flop circuit 6 thereof. That is, when the frequency of the input signal IN is expressed by (freq_2 (2n+1)), the period of the input signal IN is expressed by 1/(freq_2 (2n+1)), so that the phase is delayed by a half of the period of the input signal IN. Therefore, signals outputted from the output Qm and the inversion output Qm' of the master-side flip-flop circuit 5 in the master-slave-type D-type flip-flop circuit 4-1 have a phase delayed by one fourth period with respect to signals outputted from the output Qs and the inversion output Qs' of the slave-side flip-flop circuit 6 in the master-slave-type D-type flip-flop circuit 4-(n+1), respectively. That is, a phase is delayed by (2n+1)/2 of the above period of 1/(freq_2 (2n+1)).

Next, an operation of the second frequency dividing circuit 2 will be described.

In the master-slave-type D-type flip-flop circuit 4-(n+2), the inversion output Qs' of the slave-side flip-flop circuit 6 in the master-slave-type D-type flip-flop circuit 4-(n+1) is supplied to the clock input CLK of the master-side flip-flop circuit 5 thereof, and the inversion output Qm' of the master-side flip-flop circuit 5 in the master-slave-type D-type flip-flop circuit 4-1 is supplied to the clock input CLK of the slave-side flip-flop circuit 6 thereof. Therefore, the master-slave-type D-type flip-flop circuit 4-(n+2) generates the frequency of (freq_1) by performing ½ frequency-division on the signal having the twice of the frequency of (freq_2), and provides an output signal having the frequency (freq_1) from the output Qm and the inversion output Qm' of the master-side flip-flop circuit 5 thereof, and from the output Qs and the inversion output Qs' of the slave-side flip-flop circuit 6 thereof.

The output signals (OUT_90) and (OUT_270) outputted from the output Qm and the inversion output Qm' of the master-side flip-flop circuit 5 in the master-slave-type D-type flip-flop circuit 4-(n+2) have phases obtained by delaying, by a one fourth period, the output signals (OUT_0) and (OUT_180) outputted from the output Qs and the inversion output Qs' of the slave-side flip-flop circuit 6. That is, a 90-degree phase delay is observed.

As described above, the frequency dividing phase shift circuit according to the first embodiment of the present invention receives the input signal IN having the frequency (freq_2 (2n+1)), and generates the frequency (freq_1) by performing ½(2n+1) frequency division on the input signal IN to output the 4-phase output signals (OUT_0), (OUT_90), (OUT_180) and (OUT_270), which are different one after another in phase by 90 degrees.

Figure 6:
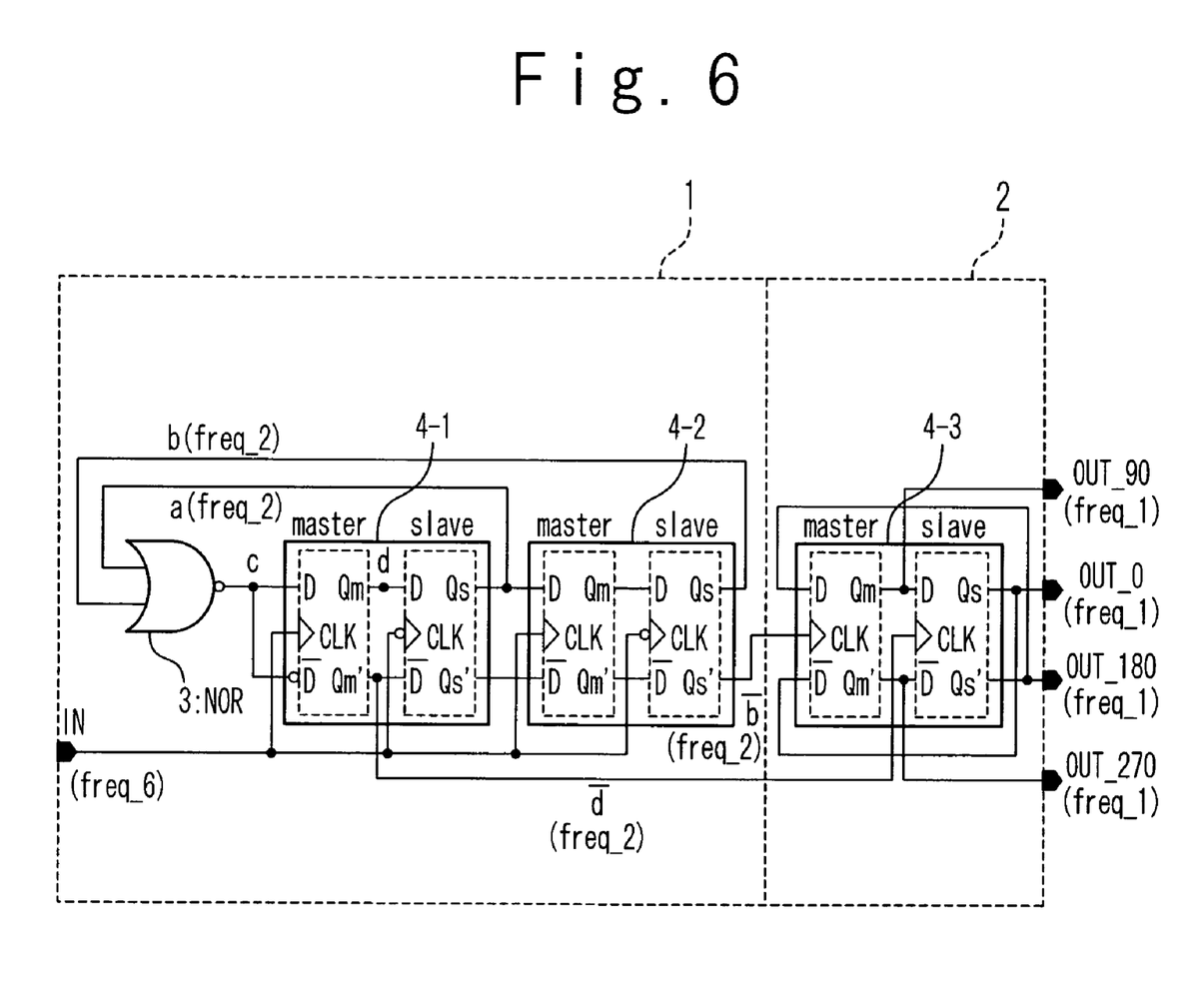
FIG. 6 is a circuit diagram showing the configuration of the frequency dividing phase shift circuit according to the first embodiment of the present invention.
Figure 7A:
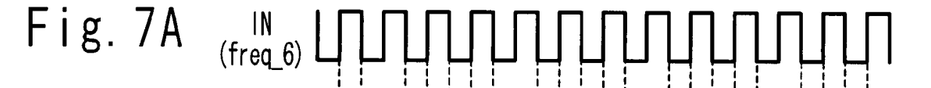
FIGS. 7A to 7J are timing charts showing an operation of the frequency dividing phase shift circuit according to the second embodiment of the present invention.
Figure 7B:
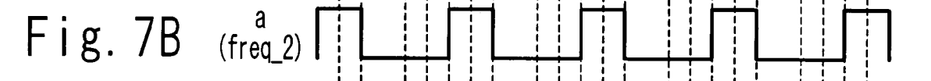
Figures 7C, 7D:
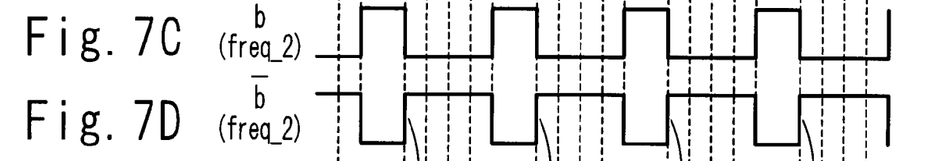
Figure 7E:
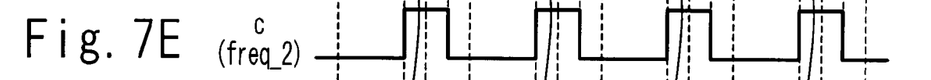
Figure 7F:
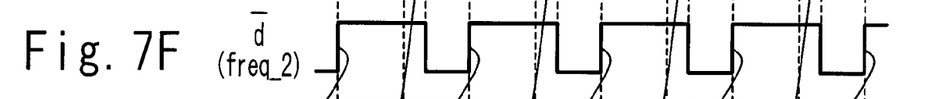
Figure 7G:
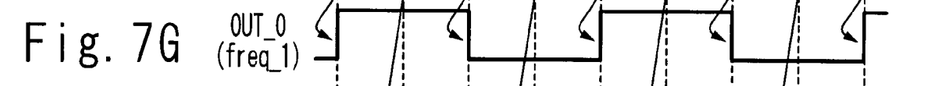
Figure 7H:
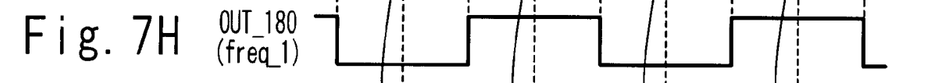
Figure 7I:
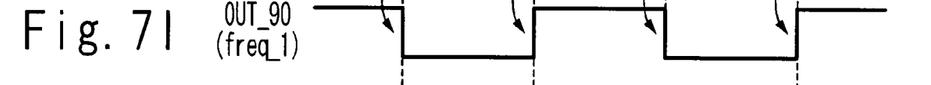
Figure 7J:
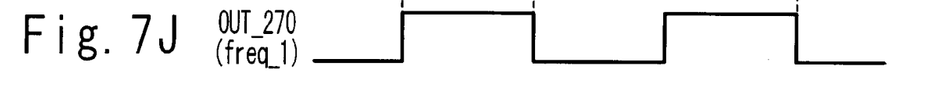

FIG. 6 shows a configuration of the frequency dividing phase shift circuit according to the second embodiment of the present invention such as 4-phase output ½(2n+1) frequency dividing phase shift circuit in case of n=1, i.e., a 4-phase output ⅙ frequency dividing phase shift circuit. The 4-phase output ⅙ frequency dividing phase shift circuit according to the present invention includes the first frequency dividing circuit 1 and the second frequency dividing circuit 2.

The first frequency dividing circuit 1 generates a signal having a frequency of twice of the frequency (freq) by performing ⅓ frequency division on the input signal IN (freq_6), and outputs a signal having the frequency of (freq_2). The second frequency dividing circuit 2 generates a signal having a frequency (freq_1) by performing ½ frequency division on the signal having the frequency of (freq_2), and outputs 4-phase output signals (OUT_0), (OUT_90), (OUT_180) and (OUT_270), which have the frequency (freq_1) and phases shifted by 90 degrees one after another. The first frequency dividing circuit 1 is provided with the NOR circuit 3, and 2 - stage master-slave-type D-type flip-flop circuits 4-1 and 4-2. The second frequency dividing circuit 2 is provided with a 1-stage master-slave-type D-type flip-flop circuit 4-3 as a 4-phase signal output circuit.

FIGS. 7A to 7J are timing charts showing an operation of the 4-phase output ⅙ frequency dividing phase shift circuit as the 4-phase output 2(2n+1) frequency dividing phase shift circuit according to the present invention in case of n=1.

First, an operation of the first frequency dividing circuit 1 will be described. Each of the master-slave-type D-type flip-flop circuits 4-1 and 4-2 generates a signal having the frequency of twice of the frequency of an input signal. Therefore, the first frequency dividing circuit 1 generates a signal having a frequency (freq_2) by using the NOR circuit 3 and performing frequency-division on the input signal IN having the frequency of (freq_6), and the signal having the frequency of (freq_2) is outputted from the output Qm and the inversion output Qm' of the master-side flip-flop circuit 5 thereof, and the output Qs and the inversion output Qs' of the slave-side flip-flop circuit 6 thereof.

The signals outputted form the output Qm and the inversion output Qm' of the master-side flip-flop circuit 5 in each of the master-slave-type D-type flip-flop circuits 4-1 and 4-2 has a phase delayed by one fourth of a period with respect to a signal outputted from the output Qs and the inversion output Qs' of the slave-side flip-flop circuit 6 thereof. That is, when the frequency of the input signal IN is expressed by (freq_6), a period of the input signal IN is expressed by 1/(freq_6), so that the phase is delayed by a half of the period in the input signal IN. Therefore, the signals d and d outputted from the output Qm and the inversion output Qm' of the master-side flip-flop circuit 5 in the master-slave-type D-type flip-flop circuit 4-1 have a phase delayed by one fourth of the period with respect to the signals b and b⁻ outputted from the output Qs and the inversion output Qs' of the slave-side flip-flop circuit 6 in the master-slave-type D-type flip-flop circuit 4-2 respectively. That is, the phase is delayed by a 1.5 times of the above period of 1/(freq_6).

Next, an operation of the second frequency dividing circuit 2 will be described. In the master-slave-type D-type flip-flop circuit 4-3, the inversion output Qs' of the slave-side flip-flop circuit 6 in the master-slave-type D-type flip-flop circuit 4-2 is supplied as the signal b⁻ to the clock input CLK of the master-side flip-flop circuit 5 thereof, and the inversion output Qm' of the master-side flip-flop circuit 5 in the master-slave-type D-type flip-flop circuit 4-1 is supplied as the signal d⁻ to the clock input CLK of the slave-side flip-flop circuit 6 thereof. Therefore, the master-slave-type D-type flip-flop circuit 4-3 generates the frequency (freq_1) by performing ½ frequency division on the signals b⁻ and d⁻, and provides an output signal having the frequency (freq_1) from the output Qm and the inversion output Qm' of the master-side flip-flop circuit 5, and the output Qs and the inversion output Qs' of the slave-side flip-flop circuit 6.

The output signals (OUT_90) and (OUT_270) outputted from the output Qm and the inversion output Qm' of the master-side flip-flop circuit 5 in the master-slave-type D-type flip-flop circuit 4-3 have phases delayed by one fourth period with respect to the output signals (OUT_0) and (OUT_180) outputted from the output Qs and the inversion output Qs' of the slave-side flip-flop circuit 6, respectively. That is, a 90-degree phase delay is observed. Thus, the 4-phase output ⅙ frequency dividing phase shift circuit according to the present invention generates the frequency (freq_1) by performing ⅙ frequency division on the input signal having the frequency of (freq_6), and outputs the 4-phase output signals (OUT_0), (OUT_90), (OUT_180) and (OUT_270), which have the frequency (freq_1) and phases shifted by 90 degrees one after another.

As described above, according to the 4-phase output ½(2n+1) frequency dividing phase shift circuit of the present invention, two configurations of the first frequency dividing circuit 1 and the second frequency dividing circuit 2 allow an input of the input signal IN having the frequency of (freq_2 (2n+1)), and a generation of a signal having the frequency of (freq_1) from the input signal IN by performing ½(2n+1) frequency division, so that it becomes possible to output the 4-phase output signals (OUT_0), (OUT_90), (OUT_180) and (OUT_270), which have the frequency (freq_1) and phases shifted by 90 degrees one after another.

According to the frequency dividing phase shift circuit of the present invention, the first frequency dividing circuit 1 includes the NOR circuit 3, and the master-slave-type D-type flip-flop circuits 4-1 to 4-(n+1) and the second frequency dividing circuit 2 includes the master-slave-type D-type flip-flop circuit 4-(n+2). If it is assumed that n is 1, the 4-phase output ⅙ frequency dividing phase shift circuit according to the present invention includes the NOR circuit 3 and the 3-stage master-slave-type D-type flip-flop circuits 4-1 to 4-3 for the first frequency dividing circuit 1 and the second frequency dividing circuit 2. Meanwhile, a conventional frequency dividing phase shift circuit has the configuration of 3-stage gate-type D-type flip-flop circuits, a one-stage latch circuit, a one-stage inverter circuit, and 3-stage AND circuits with a one-stage NAND circuit, for a first frequency dividing circuit 101, a second frequency dividing circuit 102, an NAND circuit 109, and a latch circuit 106. The conventional frequency dividing phase shift circuit is therefore complicated due to a large number of the circuits.

As described above, according to the frequency dividing phase shift circuit of the present invention, the configuration thereof is simpler than that of the conventional technique and it is possible to output the above described 4-phase output signal having the frequency (freq_1) with respect to the input signal IN having the frequency (freq_2 (2n+1)).

Moreover, according to the frequency dividing phase shift circuit of the present invention, the configuration thereof is simpler than that of the conventional technique and implementation of low current consumption and reduction of a chip layout area are possible.

What is claimed is:

1. A frequency dividing phase shift circuit comprising:
   a first frequency divider configured to perform 1/(2n+1) (n is a natural number) frequency division on an input signal having a frequency of (freq*2(2n+1)) ("freq" indicates a frequency) to generate a first signal having a frequency of (freq*2); and
   a second frequency divider configured to perform ½ frequency division on the first signal to generate 4-phase signals which are different in phase by 90 degrees one after another.

2. The frequency dividing phase shift circuit according to claim 1, wherein said first frequency divider comprises:
   (n+1)-stage master-slave type flip-flop circuits connected in series; and
   a NOR circuit configured to receive outputs of said (n+1)-stage master-slave type flip-flop circuits based on a value of (2n+1) and to output a NOR calculation result to a first stage master-slave type flip-flop circuit.

3. The frequency dividing phase shift circuit according to claim 2, wherein said second frequency divider comprises a 1-stage master-slave type flip-flop circuit connected to said first frequency divider.

4. The frequency dividing phase shift circuit according to claim 3, wherein each of said master-slave type flip-flop circuit comprises:
   a master-side flip-flop having a data input, a data inversion input, a data output and a data inversion output; and
   a slave-side flip-flop having a data input, a data inversion input, a data output and a data inversion output, wherein the data input and the data inversion input of said slave-side flip-flop are connected to the data output and the data inversion output of said master-side flip-flop.

5. The frequency dividing phase shift circuit according to claim 4, wherein the data output and the data inversion output of said slave-side flip-flop in a j-th ($1 \leq j \leq n$) stage master-slave flip-flop are connected to the data input and the data inversion input of said master-side flip-flop in a (j+1)-th stage master-slave type flip-flop circuit in said first frequency divider,
a clock input signal is supplied to a clock input of said master-side flip-flop in each of said (n+1)-stage master-slave type flip-flop circuits and an inversion of the clock input signal is supplied to an clock input of said slave-side flip-flop in each of said (n+1)-stage master-slave type flip-flop circuits,
the data inversion output of said slave-side flip-flop in a first stage of said (n+1)-stage master-slave type flip-flop circuits is connected to a clock input of said slave-side flip-flop of said 1-stage master-slave type flip-flop circuit,
the data inversion output of said slave-side flip-flop in an (n+1)-th stage of said (n+1)-stage master-slave type flip-flop circuits is connected to a clock input of said master-side flip-flop of said 1-stage master-slave type flip-flop circuit, and
the data output and the data inversion output of said slave-side flip-flop of said 1-stage master-slave type flip-flop circuit are connected to the data inversion input and the data input of said master-side flip-flop of said 1-stage master-slave type flip-flop circuit, respectively.

6. The frequency dividing phase shift circuit according to claim 5, wherein said second frequency divider outputs the data output and the data inversion output of said slave-side flip-flop of said 1-stage master-slave type flip-flop circuit as signals having phase shifts of 0 degrees and 180 degrees, and the data output and the data inversion output of said master-side flip-flop of said 1-stage master-slave type flip-flop circuit as signals having phase shifts of 90 degrees and 270 degrees, respectively.

7. The frequency dividing phase shift circuit according to claim 6, wherein when n=1, two inputs of said NOR circuit are connected to the data output of said first stage master-slave type flip-flop circuit and the data output of said (n+1)-th stage master-slave type flip-flop circuit.

8. A method of generating 4-phase signals from an inputted clock signal, comprising:
performing $1/(2n+1)$ (n is a natural number) frequency division on an inputted clock signal having a frequency of (freq*2(2n+1)) ("freq" indicates a frequency) to generate a first signal having a frequency of (freq*2); and
performing ½ frequency division on the first signal to generate 4-phase signals which are different in phase by 90 degrees one after another.

9. The method according to claim 8, wherein said performing $1/(2n+1)$ frequency division comprises:
providing (n+1)-stage master-slave type flip-flop circuits connected in series; and
providing a NOR circuit configured to receive outputs of said (n+1)-stage master-slave type flip-flop circuits based on a value of (2n+1) and to output a NOR output to a first stage master-slave type flip-flop circuit.

10. The method according to claim 9, wherein said performing ½ frequency division comprises:

providing a 1-stage master-slave type flip-flop circuit connected to said first frequency divider.

11. The frequency dividing phase shift circuit according to claim 10, wherein each of said master-slave type flip-flop circuit comprises:
a master-side flip-flop having a data input, a data inversion input, a data output and a data inversion output; and
a slave-side flip-flop having a data input, a data inversion input, a data output and a data inversion output,
said performing $1/(2n+1)$ frequency division comprises:
connecting the data input and the data inversion input of said slave-side flip-flop to the data output and the data inversion output of said master-side flip-flop, and
said performing ½ frequency division comprises:
connecting the data input and the data inversion input of said slave-side flip-flop to the data output and the data inversion output of said master-side flip-flop.

12. The method according to claim 11, wherein said performing $1/(2n+1)$ frequency division comprises:
supplying a clock input signal to a clock input of said master-side flip-flop in each of said (n+1)-stage master-slave type flip-flop circuits and an inversion of the clock input signal to an clock input of said slave-side flip-flop in each of said (n+1)-stage master-slave type flip-flop circuits; and
connecting the data output and the data inversion output of said slave-side flip-flop in a j-th ($1 \leq j \leq n$) stage master-slave flip-flop to the data input and the data inversion input of said master-side flip-flop in a (j+1)-th stage master-slave type flip-flop circuit,
said performing ½ frequency division comprises:
connecting the data inversion output of said slave-side flip-flop in a first stage of said (n+1)-stage master-slave type flip-flop circuits to a clock input of said slave-side flip-flop of said 1-stage master-slave type flip-flop circuit;
connecting the data inversion output of said slave-side flip-flop in an (n+1)-th stage of said (n+1)-stage master-slave type flip-flop circuits to a clock input of said master-side flip-flop of said 1-stage master-slave type flip-flop circuit; and
connecting the data output and the data inversion output of said slave-side flip-flop of said 1-stage master-slave type flip-flop circuit to the data inversion input and the data input of said master-side flip-flop of said 1-stage master-slave type flip-flop circuit, respectively.

13. The method according to claim 12, wherein said performing ½ frequency division comprises:
outputting the data output and the data inversion output of said slave-side flip-flop of said 1-stage master-slave type flip-flop circuit as signals having phase shifts of 0 degrees and 180 degrees; and
outputting the data output and the data inversion output of said master-side flip-flop of said 1-stage master-slave type flip-flop circuit as signals having phase shifts of 90 degrees and 270 degrees, respectively.

14. The method according to claim 13, wherein said performing $1/(2n+1)$ frequency division comprises:
connecting two inputs of said NOR circuit to the data output of said first stage master-slave type flip-flop circuit and the data output of said (n+1)-th stage master-slave type flip-flop circuit, when n=1.

* * * * *